US012635165B2

(12) United States Patent (10) Patent No.: US 12,635,165 B2
Chen et al. (45) Date of Patent: May 19, 2026

(54) SEMICONDUCTOR DEVICE AND METHOD FOR MANUFACTURING THE SAME

(71) Applicant: INNOSCIENCE (SUZHOU) TECHNOLOGY CO., LTD., Suzhou City (CN)

(72) Inventors: Fu Chen, Suzhou City (CN); Ronghui Hao, Suzhou City (CN); King Yuen Wong, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 1259 days.

(21) Appl. No.: 17/602,293

(22) PCT Filed: Aug. 13, 2021

(86) PCT No.: PCT/CN2021/112399
§ 371 (c)(1),
(2) Date: Feb. 16, 2023

(87) PCT Pub. No.: WO2023/015541
PCT Pub. Date: Feb. 16, 2023

(65) Prior Publication Data
US 2024/0030327 A1 Jan. 25, 2024

(51) Int. Cl.
H10D 30/47 (2025.01)
H10D 30/01 (2025.01)
(Continued)

(52) U.S. Cl.
CPC ........... H10D 30/47 (2025.01); H10D 30/015 (2025.01); H10D 62/8503 (2025.01); H10D 64/411 (2025.01)

(58) Field of Classification Search
None
See application file for complete search history.

(56) References Cited

U.S. PATENT DOCUMENTS 4,663,643 A 5/1987 Mimura
8,008,689 B2 * 8/2011 Miyoshi ............. H10D 30/4755
257/192

(Continued)

FOREIGN PATENT DOCUMENTS

CN 102386223 A 3/2012
CN 103337516 A 10/2013
(Continued)

OTHER PUBLICATIONS

A machine English translation of CN 113013242 A (p-channel GaN-based hetero-junction field effect transistor based on n-GaN gate) (Year: 2021).*

(Continued)

*Primary Examiner* — Khaja Ahmad
(74) *Attorney, Agent, or Firm* — Li & Cai Intellectual Property (USA) Office

(57) ABSTRACT

A semiconductor device includes a first to a third nitride-based semiconductor layers, a source electrode, a drain electrode and a gate electrode. The second nitride-based semiconductor layer is disposed on the first nitride-based semiconductor layer and has a bandgap less than a bandgap of the first nitride-based semiconductor layer, so as to form a heterojunction therebetween with a two-dimensional hole gas (2DHG) region. A third nitride-based semiconductor layer is embedded in the second nitride-based semiconductor layer and spaced apart from the first nitride-based semiconductor layer. The third nitride-based semiconductor layer is doped to have a first conductivity type different than that of the second nitride-based semiconductor layer.

20 Claims, 10 Drawing Sheets

(51) Int. Cl.
　　H10D 62/85　　　(2025.01)
　　H10D 64/27　　　(2025.01)

(56)　　　　　References Cited

U.S. PATENT DOCUMENTS

| | | | | |
|---|---|---|---|---|
| 2009/0072269 A1* | 3/2009 | Suh | .................. | H10D 84/82 |
| | | | | 257/136 |
| 2009/0146185 A1* | 6/2009 | Suh | .................. | H10D 30/472 |
| | | | | 257/E27.061 |
| 2010/0006823 A1 | 1/2010 | Anderson et al. | | |
| 2012/0187452 A1 | 7/2012 | Saito et al. | | |
| 2014/0252368 A1 | 9/2014 | Lee et al. | | |
| 2014/0253241 A1 | 9/2014 | Lee et al. | | |
| 2014/0264379 A1 | 9/2014 | Kub et al. | | |
| 2015/0303290 A1 | 10/2015 | Ueno | | |
| 2016/0126339 A1 | 5/2016 | Lee et al. | | |

FOREIGN PATENT DOCUMENTS

| | | | | |
|---|---|---|---|---|
| CN | 103715249 A | 4/2014 | | |
| CN | 106653825 A | 5/2017 | | |
| CN | 108155099 A | 6/2018 | | |
| CN | 109037326 A * | 12/2018 | ............ | H10D 30/47 |
| CN | 209447805 U | 9/2019 | | |
| CN | 113013242 A * | 6/2021 | .......... | H10D 30/475 |
| CN | 113130642 A | 7/2021 | | |
| JP | 2005243727 A | 9/2005 | | |

OTHER PUBLICATIONS

English translation of CN 109037326 A (Year: 2018).*

International Search Report and Written Opinion of the corresponding PCT application No. PCT/CN2021/112399 mailed on Apr. 26, 2022.

Notice of Allowance of corresponding China patent application No. 202180003554.5 mailed on Sep. 27, 2022.

Ashwani Kumar et al., "Impact of channel thickness on the performance of an E-mode p-channel MOSHFET in GaN", Applied Physics Letters, Apr. 11, 2018, 153503.

Fu Chen et al., "Enhancement-mode n-GaN gate p-channel heterostructure field effect transistors based on GaN/AlGaN 2D hole gas", Applied Physics Letters, Sep. 9, 2019, 112103.

Herwig Hahn et al., "p-Channel Enhancement and Depletion Mode GaN-Based HFETs With Quaternary Backbarriers", IEEE Transactions on Electron Devices, Oct. 2013, p. 3005-3011.

First Office Action of the corresponding China patent application No. 202180003554.5 mailed on Jul. 13, 2022.

* cited by examiner

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a p-channel enhancement mode semiconductor device having a channel layer embedded/buried with a doped region that has a conductivity type differing from that of the channel layer.

BACKGROUND

In recent years, intense research on high-hole-mobility transistors (HHMTs) has been prevalent, particularly for high power switching and high frequency applications. III-nitride-based HHMTs utilize a heterojunction interface between two materials with different bandgaps to form a quantum well-like structure, which accommodates a two-dimensional hole gas (2DHG) region, satisfying demands of high power/frequency devices. With respect to practical demands, the HHMTs need to be designed to be normally-off. However, due to process factors, the development of the normally-off HHMTs encounters manufacturing challenges. At present, there is a need to improve the yield rate for the normally-off HHMTs, thereby making them suitable for mass production.

SUMMARY OF THE DISCLOSURE

In accordance with one aspect of the present disclosure, a semiconductor device is provided. A semiconductor device includes a first nitride-based semiconductor layer, a second nitride-based semiconductor layer, a third nitride-based semiconductor layer, a source electrode, a drain electrode and a gate electrode. The second nitride-based semiconductor layer is disposed on the first nitride-based semiconductor layer and has a bandgap less than a bandgap of the first nitride-based semiconductor layer, so as to form a hetero-junction therebetween with a two-dimensional hole gas (2DHG) region. A third nitride-based semiconductor layer is embedded in the second nitride-based semiconductor layer and spaced apart from the first nitride-based semiconductor layer. The third nitride-based semiconductor layer is doped to have a first conductivity type different than that of the second nitride-based semiconductor layer. A source electrode and a drain electrode are disposed on the second nitride-based semiconductor layer. A gate electrode is disposed over the second nitride-based semiconductor layer and between the source and drain electrodes. The gate electrode is located directly over the third nitride-based semiconductor layer.

In accordance with one aspect of the present disclosure, a semiconductor device is provided. A semiconductor device includes a first nitride-based semiconductor layer, a second nitride-based semiconductor layer, a source electrode, a drain electrode and a gate electrode. The second nitride-based semiconductor layer is disposed on the first nitride-based semiconductor layer and has a bandgap less than a bandgap of the first nitride-based semiconductor layer, so as to form a heterojunction therebetween with a two-dimensional hole gas (2DHG) region. The second nitride-based semiconductor layer has an undoped region and a doped region enclosed by the undoped region and is spaced apart from the heterojunction and from a top surface of the second nitride-based semiconductor layer. The source electrode and a drain electrode are disposed the second nitride-based semiconductor layer. The gate electrode is disposed over the second nitride-based semiconductor layer and between the source and drain electrodes. The gate electrode vertically aligns with the doped region of the second nitride-based semiconductor layer.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer to form a heterojunction therebetween. A third nitride-based semiconductor layer is formed on the second nitride-based semiconductor layer, in which the third nitride-based semiconductor layer is doped to have a conductivity type different than that of the second nitride-based semiconductor layer. A fourth nitride-based semiconductor layer is formed to cover the second and third nitride-based semiconductor layers. A gate electrode is formed above the fourth nitride-based semiconductor layer and aligns with the third nitride-based semiconductor layer. A source electrode and a drain electrode are formed above the fourth nitride-based semiconductor layer and spaced apart from the third nitride-based semiconductor layer.

By the above configuration, the first and the second nitride-based semiconductor layers with different band gaps are stacked on one another, so as to form a heterojunction therebetween with a 2DHG region. The third nitride-based semiconductor layer, which has a conductivity type different from that of the second nitride-based semiconductor layer, is embedded/buried in the second nitride-based semiconductor layer. Therefore, the third nitride-based semiconductor layer can deplete a portion of the 2DHG region, resulting in the semiconductor device having an enhancement-mode. The manufacturing process of the semiconductor device is simple and avoids using etching step to form a recess into the second nitride-based semiconductor layer (e.g., channel layer). Thus, the semiconductor device of the present disclosure can have a good reliability, good electrical properties and a good yield rate.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
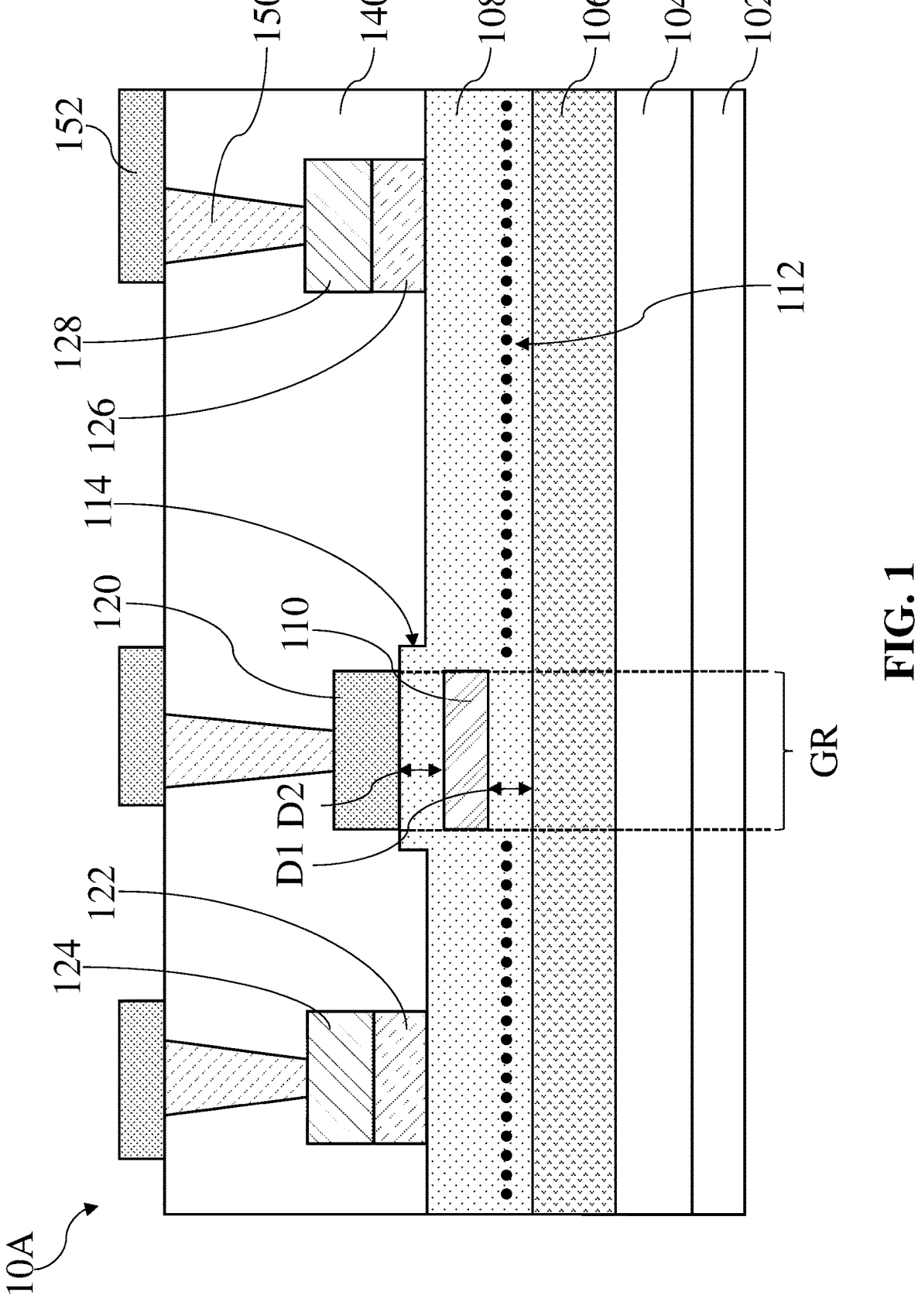
FIG. 1 is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a vertical cross-sectional of a semiconductor device 10A according to some embodiments of the present disclosure. The semiconductor device 10A includes a substrate 102, a buffer layer 104, nitride-based semiconductor layers 106, 108 and 110, a gate electrode 120, a nitride-based semiconductor layer 122, a source electrode 124, a nitride-based semiconductor layer 126, a drain electrode 128, a passivation layer 140, contact vias 150, and a patterned conductive layer 152.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 104 can be disposed on/over/above the substrate 102. The buffer layer 104 can be disposed between the substrate 102 and the nitride-based semiconductor layer 106. The buffer layer 104 can be configured to reduce lattice and thermal mismatches between the substrate 102 and the nitride-based semiconductor layer 106, thereby curing defects due to the mismatches/difference. The buffer layer 104 may include a III-V compound. The III-V compound can include, for example but are not limited to, aluminum, gallium, indium, nitrogen, or combinations thereof. Accordingly, the exemplary materials of the buffer layer 104 can further include, for example but are not limited to, GaN, AlN, AlGaN, InAlGaN, or combinations thereof. In some embodiments, the semiconductor device may further include a nucleation layer (not shown). The nucleation layer may be formed between the substrate 102 and the buffer layer 104. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The nitride-based semiconductor layer 106 can be disposed on/over/above the buffer layer 104. The nitride-based semiconductor layer 108 can be disposed on/over/above the nitride-based semiconductor layer 104. The nitride-based semiconductor layer 108 is an intrinsic semiconductor, which means that the nitride-based semiconductor layer 108 is an undoped semiconductor layer. The exemplary materials of the nitride-based semiconductor layer 108 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$.

The exemplary materials of the nitride-based semiconductor layers 106 and 108 are selected such that the nitride-based semiconductor layer 108 has a bandgap (i.e., forbidden band width) less than a bandgap of the nitride-based semiconductor layer 106, which causes electron affinities thereof different from each other and forms a heterojunction therebetween. For example, when the nitride-based semiconductor layer 106 is an AlGaN layer having bandgap of approximately 4.0 eV, the nitride-based semiconductor layer 108 can be selected as an undoped GaN layer having a bandgap of approximately 3.4 eV. As such, the nitride-based semiconductor layers 106 and 108 can serve as a barrier layer and a channel layer, respectively. A triangular well potential is generated at a bonded interface between the channel and barrier layers, so that holes accumulate in the triangular well, thereby generating a two-dimensional hole gas (2DHG) region 112 adjacent to the heterojunction. Accordingly, the semiconductor device 10A is available to include at least one GaN-based high-hole-mobility transistor (HHMT).

The nitride-based semiconductor layer 110 can be disposed in the nitride-based semiconductor layer 108. The nitride-based semiconductor layer 110 is buried/embedded in the nitride-based semiconductor layer 108. The nitride-based semiconductor layer 110 is surrounded/enclosed by the nitride-based semiconductor layer 108. Accordingly, the nitride-based semiconductor layer 110 is spaced apart from the nitride-based semiconductor layer 106 by a material of the nitride-based semiconductor layer 108. The nitride-based semiconductor layer 110 is separated from the heterojunction (i.e., which is directly formed between the nitride-based semiconductor layers 106 and 108) by a portion of the nitride-based semiconductor layer 108.

The nitride-based semiconductor layer 110 is doped to have a conductivity type different than that of the nitride-based semiconductor layer 108. In some embodiments, the conductivity type of the nitride-based semiconductor layer 110 is an n-type. Therefore, the nitride-based semiconductor layer 110 can be served as an electron supply layer. Broadly speaking, the holes in the 2DHG region 112 can be viewed as a p-type substances, such that the holes and the nitride-based semiconductor layer 110 can collectively form a p-n junction equivalently. As such, the nitride-based semiconductor layer 110 can deplete a zone of the 2DHG region 112 directly beneath the nitride-based semiconductor layer 110, resulting in forming the discontinuous 2DHG region 112.

The exemplary materials of the nitride-based semiconductor layer 110 can include, for example but are not limited to, n-doped group III-V nitride semiconductor materials, such as n-type GaN, n-type AlGaN, n-type InN, n-type AlInN, n-type InGaN, n-type AlInGaN, or combinations thereof. In some embodiments, the n-doped materials are achieved by using a n-type impurity, such as C, Si, and Ge.

In some embodiments, the nitride-based semiconductor layers 108 and 110 have the same compounds at different properties. For example, the nitride-based semiconductor layers 108 and 110 can have the same III-V compounds, in which the nitride-based semiconductor layer 108 is undoped and the nitride-based semiconductor layer 110 is n-type doped. Accordingly, the nitride-based semiconductor layer 110 can act as an n-type doped region in the undoped region of the nitride-based semiconductor layer 108. In this regard, the doped region (e.g., the nitride-based semiconductor layer 110) is spaced apart from the heterojunction which is directly formed between the nitride-based semiconductor layers 106 and 108. The doped region (e.g., the nitride-based semiconductor layer 110) is spaced apart from a top surface of the nitride-based semiconductor layer 108.

The nitride-based semiconductor layer 108 has a protruding portion 114 directly above the nitride-based semiconductor layer 110. The protruding portion 114 is formed because of the occupied of the nitride-based semiconductor layer 110 in the nitride-based semiconductor layer 108. Hence, an orthogonal/vertical projection of the nitride-based semiconductor layer 110 on the nitride-based semiconductor layer 108 is within in an orthogonal/vertical projection of the protruding portion 114 on the nitride-based semiconductor layer 108. The protruding portion 114 extends away from the nitride-based semiconductor layer 110. A width of the protruding portion 114 can be greater than that of the nitride-based semiconductor layer 110.

The nitride-based semiconductor layers 122 and 126 are disposed on/above/over the nitride-based semiconductor layer 108. The nitride-based semiconductor layer 110 can be disposed between the nitride-based semiconductor layers 122 and 126. The nitride-based semiconductor layers 122 and 126 are directly in contact with different portions of the nitride-based semiconductor layer 108. The nitride-based semiconductor layers 122 and 126 are located at two opposite sides of the protruding portion 114 of the nitride-based semiconductor layer 108, respectively. The protruding portion 114 is spaced apart from the nitride-based semiconductor layers 122 and 126.

The nitride-based semiconductor layers 122 and 126 are doped to have a conductivity type different than the conductivity type of the nitride-based semiconductor layer 110. The nitride-based semiconductor layers 122 and 126 are doped to have the same conductivity type, such as a p-type. The exemplary materials of the nitride-based semiconductor layers 122 and 126 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg.

In some embodiments, the nitride-based semiconductor layers 108, 110, 122 and 126 have the same group III element and the same group V element. For example, the nitride-based semiconductor layer 108 can be an undoped GaN layer, which means that the nitride-based semiconductor layer 108 is an intrinsic semiconductor. The nitride-based semiconductor layer 110 can be an n-doped GaN layer, which means that the nitride-based semiconductor layer 110 is an n-type semiconductor. The nitride-based semiconductor layers 122 and 126 can be p-doped GaN layers, which means that the nitride-based semiconductor layers 122 and 126 are p-type semiconductors. That is, the nitride-based semiconductor layers 108, 110, 122 and 126 have the same group III element (e.g., gallium (Ga)) and the same group V element (e.g., the nitrogen (N)). Thus, the lattice mismatch between one of the nitride-based semiconductor layers 108, 110 and 122 and the nitride-based semiconductor layer 126 can be reduced.

The source and the drain electrodes 124 and 128 can be disposed on/over/above the nitride-based semiconductor layer 108. The source and the drain electrodes 124 and 128 are directly in contact with the nitride-based semiconductor layers 122 and 126, respectively.

The source electrode 124 and the nitride-based semiconductor layer 122 can serve as a source structure. The nitride-based semiconductor layer 122 is disposed between the source electrode 124 and the nitride-based semiconductor layer 108, such that the source electrode 124 can form an ohmic contact with the nitride-based semiconductor layer 108 through the nitride-based semiconductor layer 122. In some embodiments, the nitride-based semiconductor layer 122 can be omitted, such that the source electrode 124 can be directly in contact with the nitride-based semiconductor layer 108.

The drain electrode 128 and the nitride-based semiconductor layer 126 can serve as a drain structure. The nitride-based semiconductor layer 126 is disposed between the drain electrode 128 and the nitride-based semiconductor layer 108, such that the drain electrode 128 can form an ohmic contact with the nitride-based semiconductor layer 108 through the nitride-based semiconductor layer 126. In some embodiments, the nitride-based semiconductor layer 126 can be omitted, such that the drain electrode 128 can be directly in contact with the nitride-based semiconductor layer 108.

The protruding portion 114 of the nitride-based semiconductor layer 108 is located between the source and the drain electrodes 124 and 128. The source and the drain electrodes 124 and 128 are spaced apart from the protruding portion 114. In the exemplary illustration of FIG. 1, the source and the drain electrodes 124 and 128 are asymmetrical about the protruding portion 114. For example, the source electrode 124 can be closer to the protruding portion 114 than the drain electrode 128. In other embodiments, the source and the drain electrodes 124 and 128 are symmetrical about the protruding portion 114. The distance between the source electrode 124 and the protruding portion 114 can be adjusted/altered to meet different device requirements. The distance between the drain electrode 128 and the protruding portion 114 can be adjusted/altered to meet different device requirements.

In some embodiments, the source electrode 124 and the drain electrode 128 can include, for example but are not limited to, metals, alloys, doped semiconductor materials (such as doped crystalline silicon), compounds such as silicides and nitrides, other conductor materials, or combinations thereof. The exemplary materials of the source electrode 124 and the drain electrode 128 can include, for example but are not limited to, Ti, AlSi, TiN, or combinations thereof. Each of the source electrode 124 and the drain electrode 128 may be a single layer, or plural layers of the same or different composition. Furthermore, the ohmic contacts can be achieved by applying Ti, Al, or other suitable materials to the source electrode 124 and the drain electrode 128. In some embodiments, each of the source electrode 124 and the drain electrode 128 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The gate electrode 120 can be disposed on/above/over the nitride-based semiconductor layer 108. The gate electrode 120 is directly in contact with the protruding portion 114 of the nitride-based semiconductor layer 108. The gate electrode 120 is located directly over the nitride-based semiconductor layer 110 (e.g., n-doped region). The gate electrode 120 is spaced apart from the nitride-based semiconductor layers 122 and 126. The gate electrode 120 is spaced apart from the source electrode 124 and the drain electrode 128. Each of the source electrode 124 and the drain electrode 128 can be in a position higher than the protruding portion 114 where the gate electrode 120 is located. Therefore, the gate electrode 120 can be lower than the source electrode 124 and the drain electrode 128. Such a configuration can avoid the semiconductor device 10A from becoming too thick.

The exemplary materials of the gate electrode 120 may include metals or metal compounds. The gate electrode 120 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The source electrode 124, the drain electrode 128, and the gate electrode 120 can constitute parts of a HHMT transistor in the semiconductor device 10A. In some embodiments, these elements can constitute parts of a p-channel transistor. By embedding the nitride-based semiconductor layer 110 into the nitride-based semiconductor layer 108, the semiconductor device 10A can be configured as an enhancement mode device, which is in a normally-off state when the gate electrode 120 is at approximately zero bias.

As afore-mentioned, the major carriers (e.g., electrons) in the nitride-based semiconductor layer 110 can deplete/neutralize a zone of the 2DHG region 112 directly beneath the nitride-based semiconductor layer 110 and the gate electrode 120. This zone has different characteristics (e.g., different hole concentrations) than the remaining of the 2DHG region 112 and thus is blocked, creating the discontinuous 2DHG region 112.

Due to this mechanism, the semiconductor device 10A has a normally-off characteristic. As such, when no voltage is applied to the gate electrode 120 or a voltage applied to the gate electrode 120 is less than a threshold voltage (i.e., a minimum voltage required to form an inversion layer below the gate electrode 120), the zone of the 2DHG region

112 below the gate electrode 120 is kept blocked, and thus no current flows therethrough.

In this regard, to achieve a normally-off p-channel semiconductor device, practically, other manners for disrupting continuity of a 2DHG region of a p-channel semiconductor device between source and drain electrodes may be used. One way to achieve a normally-off p-channel semiconductor device is to form a recess structure filled with a gate electrode, thereby extinguishing a zone of a 2DHG region directly under the gate electrode. Accordingly, there is a need to perform a destructive step, such as an etching step. However, the recessed surface may result in carrier scattering, thereby reducing the carrier mobility and enhancing the on-resistance of the semiconductor device.

As compared with the afore-mentioned normally-off p-channel semiconductor device with a recess structure, the semiconductor device 10A creates the discontinuous 2DHG region 112 in the nitride-based semiconductor layer 108 by burying/embedding the nitride-based semiconductor layer 110 therein. The continuity of the 2DHG region 112 is interrupted by the nitride-based semiconductor layer 110, since the hole concentration of the heterojunction beneath the nitride-based semiconductor layer 110 approaches to zero or about zero. Hence, the p-channel enhancement mode semiconductor device can be realized.

In the embodiments of the present disclosure, there is no need to form a recess structure into the nitride-based semiconductor layer 108, thereby exempting an issue of controlling the depth of the recess structure. As such, the gate electrode 120 can be disposed on the nitride-based semiconductor layer 108 instead of being disposed in an inward recess. Such a configuration would not interfere with the hole transportation in the nitride-based semiconductor layer 108.

Furthermore, since the nitride-based semiconductor layer 110 is buried/embedded in a position adjacent to a zone of the 2DHG region 112, the zone of the 2DHG region can be well depleted. Hence, in a normally-off state, no current will flow through the gate region GR. Because the on-off ratio is defined as a current in a normally-on state to a current in a normally-off state, the semiconductor device 10A can have a high on-off ratio due to an extremely low off-state current. In summary, the semiconductor device 10A can have good electrical properties, a good reliability and a good yield rate.

In addition, in the exemplary illustration of FIG. 1, the gate electrode 120 has a pair of opposite edges aligning with a pair of opposite edges of the nitride-based semiconductor layer 110, respectively, which means that the gate electrode 120 vertically aligns with the nitride-based semiconductor layer 110. Accordingly, a width of the gate electrode 120 can be the same as a width of the nitride-based semiconductor layer 110. As such, during the formation of the gate electrode 120 and the formation of the nitride-based semiconductor layer 110, the same reticle can be used.

Due to the alignment design, an orthogonal/vertical projection of the gate electrode 120 on the nitride-based semiconductor layer 108 can align with an orthogonal/vertical projection of the nitride-based semiconductor layer 110 on the nitride-based semiconductor layer 108, which is advantageous to deplete the desired zone in the 2DHG region 112. Accordingly, the conductivity of remaining zones of the 2DHG region 112 can be well maintained.

The vertical position of the nitride-based semiconductor layer 110 is adjustable. The nitride-based semiconductor layer 110 is spaced apart from the heterojunction by a distance D1. The nitride-based semiconductor layer 110 is spaced apart from the top-most surface of the nitride-based semiconductor layer 108 by a distance D2. The relationship between the distances D1 and D2 can be related to the carrier concentration of the 2DHG region 112 and the threshold voltage of the semiconductor device 10A.

In some embodiments, the distances D1 is equal to the distance D2. In some embodiments, the distances D1 is greater than the distance D2. In some embodiments, the distances D1 is less than the distance D2. The electrical properties of the semiconductor device 10A can be adjusted through the relationship between the distances D1 and D2 in combination of the doped concentration of the nitride-based semiconductor layer 110, so as to meet different device requirements. As such, the design of the present disclosure is flexible and convenient to tune the electrical properties of the semiconductor device 10A, being available to satisfy different device requirements.

The passivation layer 140 covers the gate, source and the drain electrodes 120, 124 and 128, the nitride-based semiconductor layers 122 and 126. In some embodiments, the passivation layer 140 can serve as a planarization layer which has a level top surface to support other layers/ elements. In some embodiments, the passivation layer 140 can be formed as a thicker layer, and a planarization process, such as chemical mechanical polish (CMP) process, is performed on the passivation layer 140 to remove the excess portions, thereby forming a level top surface. The material of the passivation layer 140 can include, for example but are not limited to, dielectric materials. For example, the passivation layer 140 can include $SiN_x$, $SiO_x$, SiON, SiC, SiBN, SiCBN, oxides, nitrides, plasma enhanced oxide (PEOX), or combinations thereof.

The contact vias 150 are disposed within the passivation layer 140. The contact vias 150 can penetrate the passivation layer 140. The contact vias 150 can extend longitudinally to connect to the gate, source and the drain electrodes 120, 124 and 128. The upper surfaces of the contact vias 150 are free from coverage of the passivation layer 140. The exemplary materials of the contact vias 150 can include, for example but are not limited to, conductive materials, such as metals or alloys.

The patterned conductive layer 152 is disposed on/over/ above the passivation layer 140 and the contact vias 150. The patterned conductive layer 152 is in contact with the contact vias 150. The patterned conductive layer 152 may have metal lines, pads, traces, or combinations thereof, such that the patterned conductive layer 152 can form at least one circuit. Hence, the patterned conductive layer 152 can be served as a patterned circuit layer. The patterned conductive layer 152 can connect with the gate, source and drain electrodes 120, 124 and 128 by the contact vias 150. An external electronic device can send at least one electronic signal to the semiconductor device 10A by the patterned conductive layer 152, and vice versa. The exemplary materials of the patterned conductive layer 152 can include, for example but are not limited to, conductive materials. The patterned conductive layer 152 may include a single film or multilayered film having Ag, Al, Cu, Mo, Ni, Ti, alloys thereof, oxides thereof, nitrides thereof, or combinations thereof.

Different stages of a method for manufacturing the semiconductor device 10A are shown in FIG. 2A, FIG. 2B, FIG. 2C, FIG. 2D, FIG. 2E and FIG. 2F, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figures 2A, 2B:
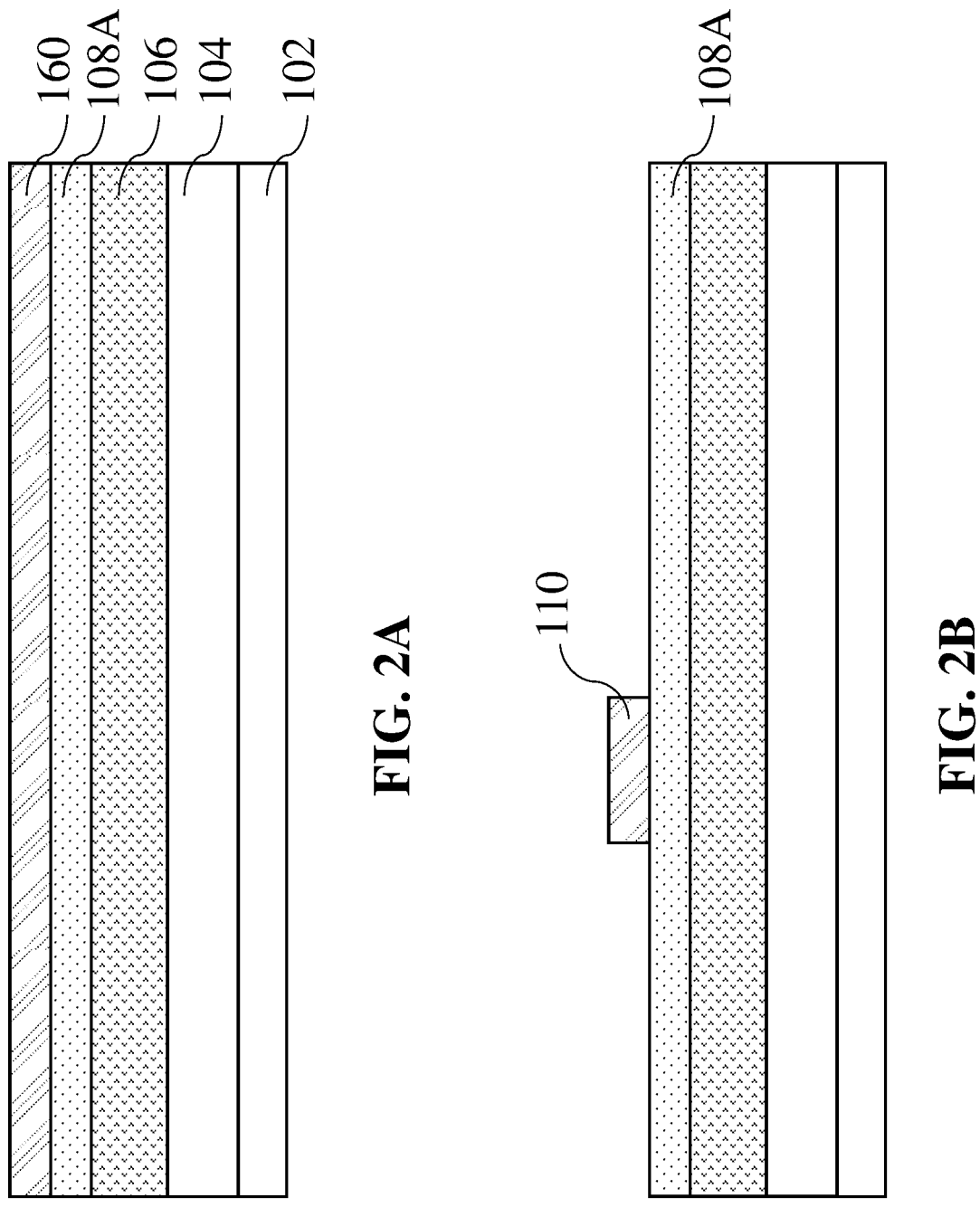
FIG. 2A, FIG. 2B, FIG. 2C, FIG. 2D, FIG. 2E, and FIG. 2F show different stages of a method for manufacturing a nitride-based semiconductor device according to some embodiments of the present disclosure.

Referring to FIG. 2A, a buffer layer 104 is formed on a substrate 102 by using deposition techniques. A nitride-based semiconductor layer 106 is formed on the buffer layer 104 by using deposition techniques. A nitride-based semiconductor layer 108A can be formed on the nitride-based semiconductor layer 106 by using deposition technique, so that a heterojunction is formed therebetween. A blanket nitride-based semiconductor layer 160 is formed on the nitride-based semiconductor layer 108A, in which the blanket nitride-based semiconductor layer 160 is doped to have a conductivity type different than that of the nitride-based semiconductor layer 108A. To be more specific, the blanket nitride-based semiconductor layer 160 is an n-type, and the nitride-based semiconductor layer 108A is undoped.

Referring to FIG. 2B, a patterning process is performed on the blanket nitride-based semiconductor layer 160 for removing excess portions thereof so as to form a nitride-based semiconductor layer 110. In some embodiments, the patterning process can include photolithography, exposure and development, etching, other suitable processes, or combinations thereof.

Figures 2C, 2D:
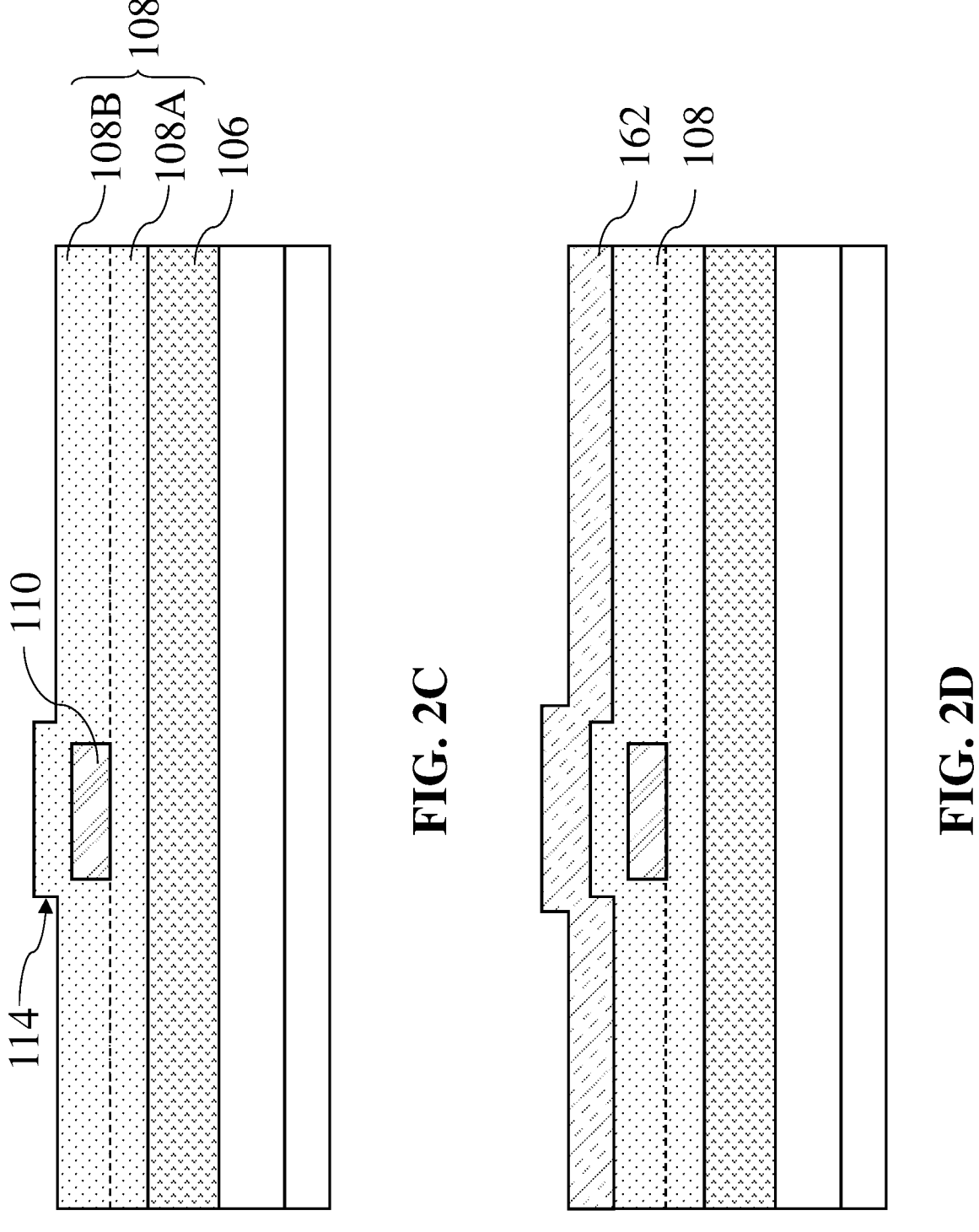

Referring to FIG. 2C, a nitride-based semiconductor layer 108B is formed to cover the nitride-based semiconductor layers 106, 108A and 110. A protruding portion 114 of the nitride-based semiconductor layer 108B is formed directly on the nitride-based semiconductor layer 110. It should be noted that the conductivity types of the nitride-based semiconductor layers 108A and 108B are undoped, such that the nitride-based semiconductor layers 108A and 108B can be merged as a nitride-based semiconductor layer 108.

Referring to FIG. 2D, a blanket nitride-based semiconductor layer 162 is formed on the nitride-based semiconductor layer 108, in which the conductivity type of the blanket nitride-based semiconductor layer 162 is a p-type.

Figures 2E, 2F:
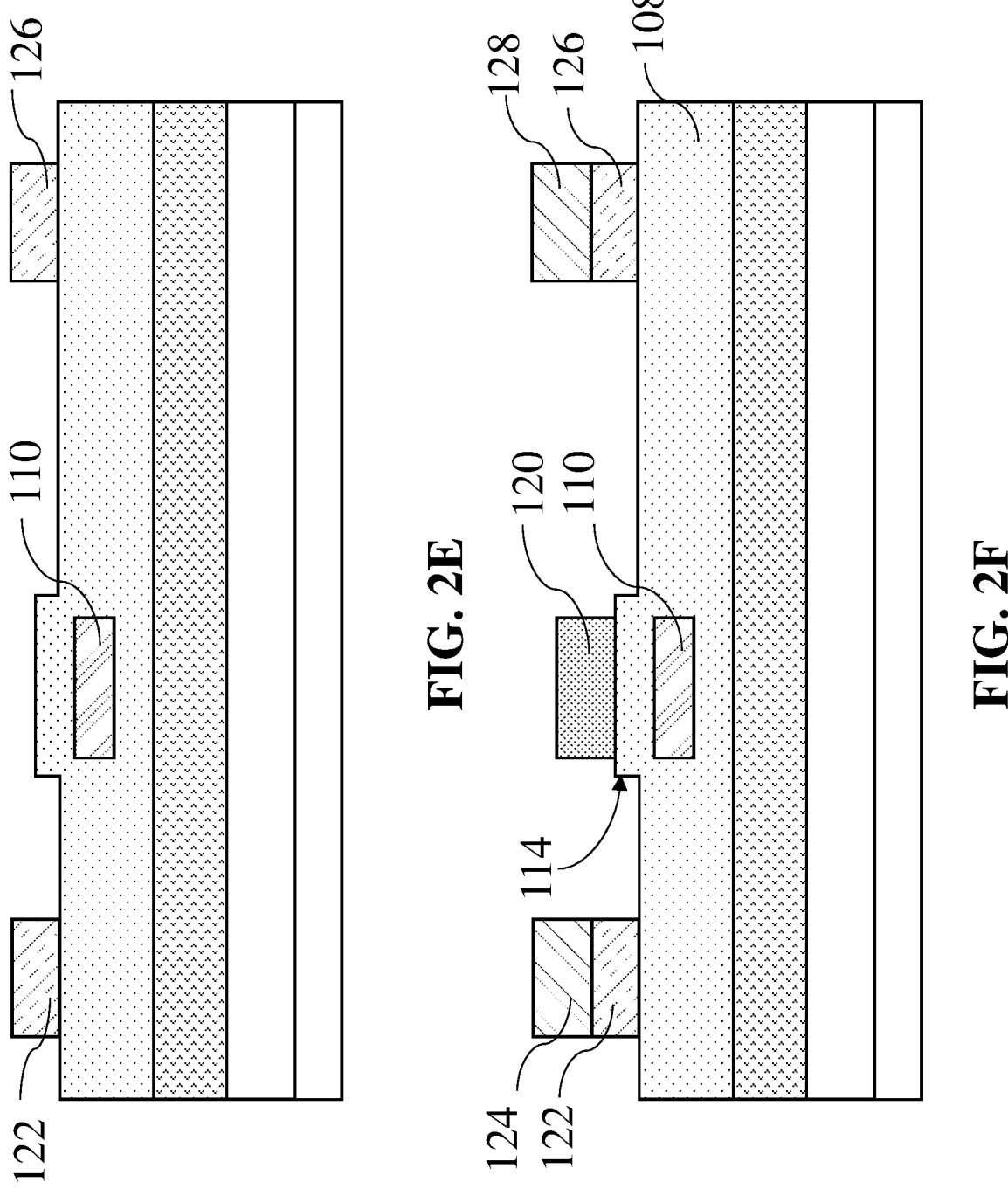

Referring to FIG. 2E, a patterning process is performed on the blanket nitride-based semiconductor layer 162 for removing excess portions thereof, so as to form the nitride-based semiconductor layers 122 and 126. It should be noted that the locations of the nitride-based semiconductor layers 122 and 126 can be defined as a source and drain regions, respectively.

Referring to FIG. 2F, a source electrode 124 and a drain electrode 128 are formed on the nitride-based semiconductor layers 122 and 126, respectively, and the source and the drain electrode 124 and 128 are spaced apart from the nitride-based semiconductor layer 110. A gate electrode 120 is formed on the protruding portion 114 of the nitride-based semiconductor layer 108 and aligns with the nitride-based semiconductor layer 110. The formation of the gate, source and drain electrodes 120, 124 and 128 includes deposition techniques and a patterning process. In some embodiments, the deposition techniques can be performed for forming a blanket layer, and the patterning process can be performed for removing excess portions thereof. Thereafter, the passivation layer 140, the contact vias 150, and the patterned conductive layer 152 can be formed, obtaining the configuration of the semiconductor device 10A as shown in FIG. 1.

Figure 3:
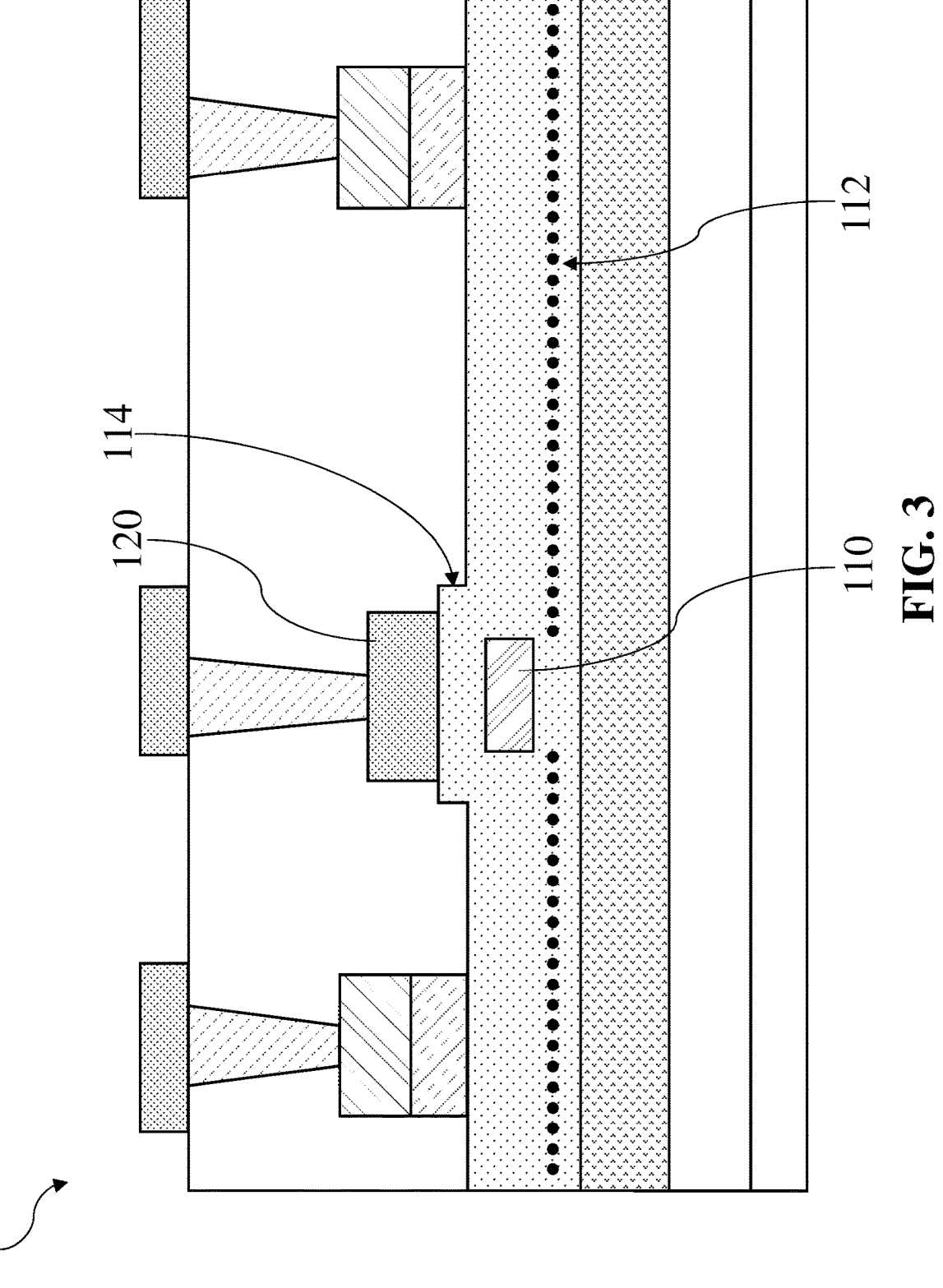
FIG. 3 is a vertical cross-sectional view of a semiconductor device according to some embodiments of the present disclosure.

FIG. 3 is a vertical cross-sectional view of a semiconductor device 10B according to some embodiments of the present disclosure. In the exemplary illustration of FIG. 3, the gate electrode 120 is partially in contact with a top surface of the protruding portion 114. A width of the gate electrode 120 can be greater than that of the nitride-based semiconductor layer 110. The width of the gate electrode 120 can be smaller than that of the protruding portion 114.

Figure 4:
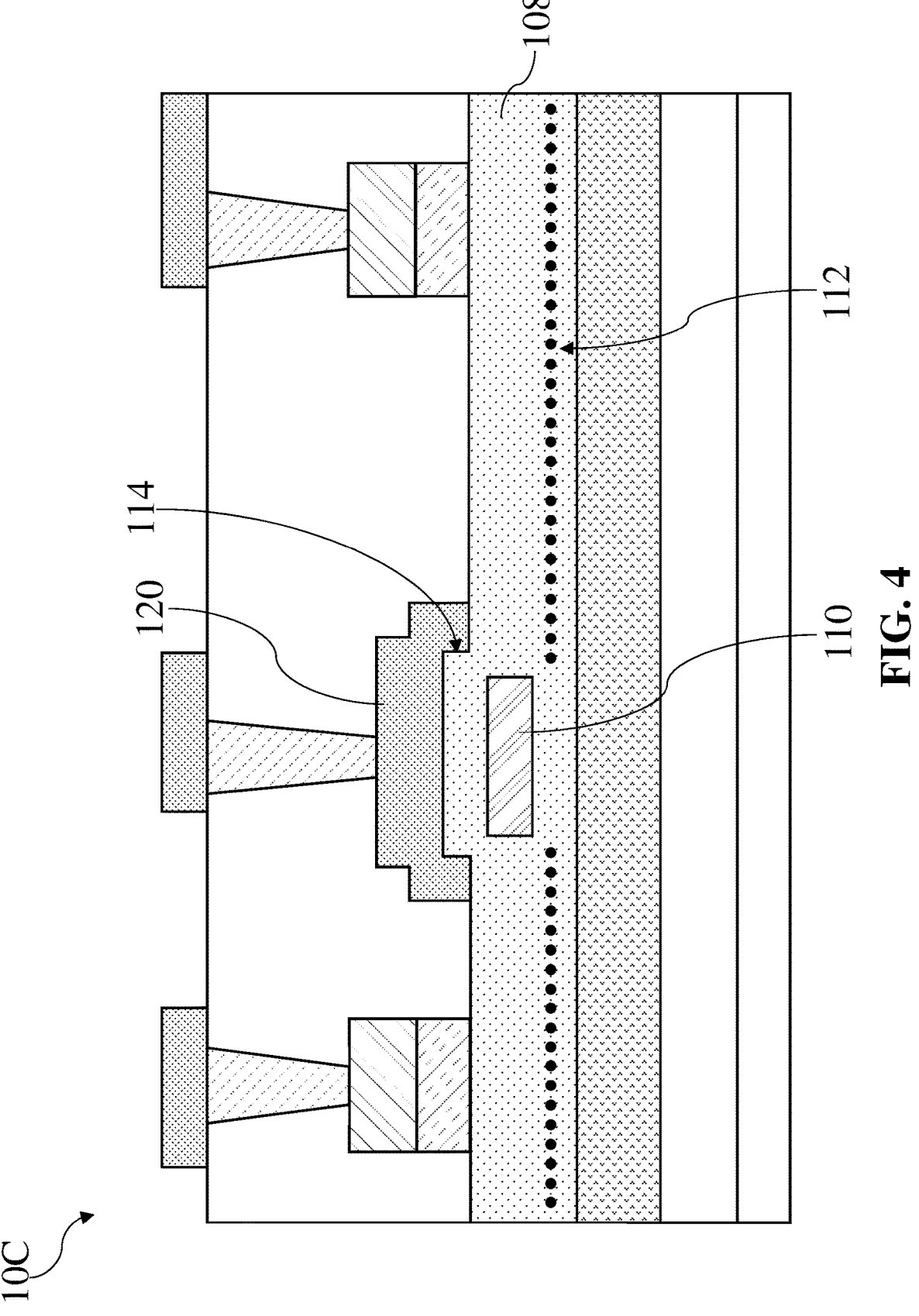
FIG. 4 is a vertical cross-sectional view of a semiconductor device according to some embodiments of the present disclosure.

FIG. 4 is a vertical cross-sectional view of a semiconductor device 10C according to some embodiments of the present disclosure. In the exemplary illustration of FIG. 4, the gate electrode 120 is conformal with the nitride-based semiconductor layer 108. The gate electrode 120 covers the protruding portion 114 and at least a part of the remaining portion of the nitride-based semiconductor layer 108. As such, the gate electrode 120 can be in contact with a top surface and side surfaces of the protruding portion 114. The width of the gate electrode 120 can be greater than that of the protruding portion 114.

In the semiconductor devices 10B and 10C, the gate electrode 120 is wider than the nitride-based semiconductor layer 110. Such a configuration can bear high process variation. Moreover, the gate electrode 120 can overlap with at least one zone of the 2DHG region 112, and thus the gate electric field may assist to increase the conductivity of the overlapping zone as a voltage is applied to the gate electrode 120, thereby further reducing the on-resistance of the semiconductor devices 10B and 10C.

Figure 5:
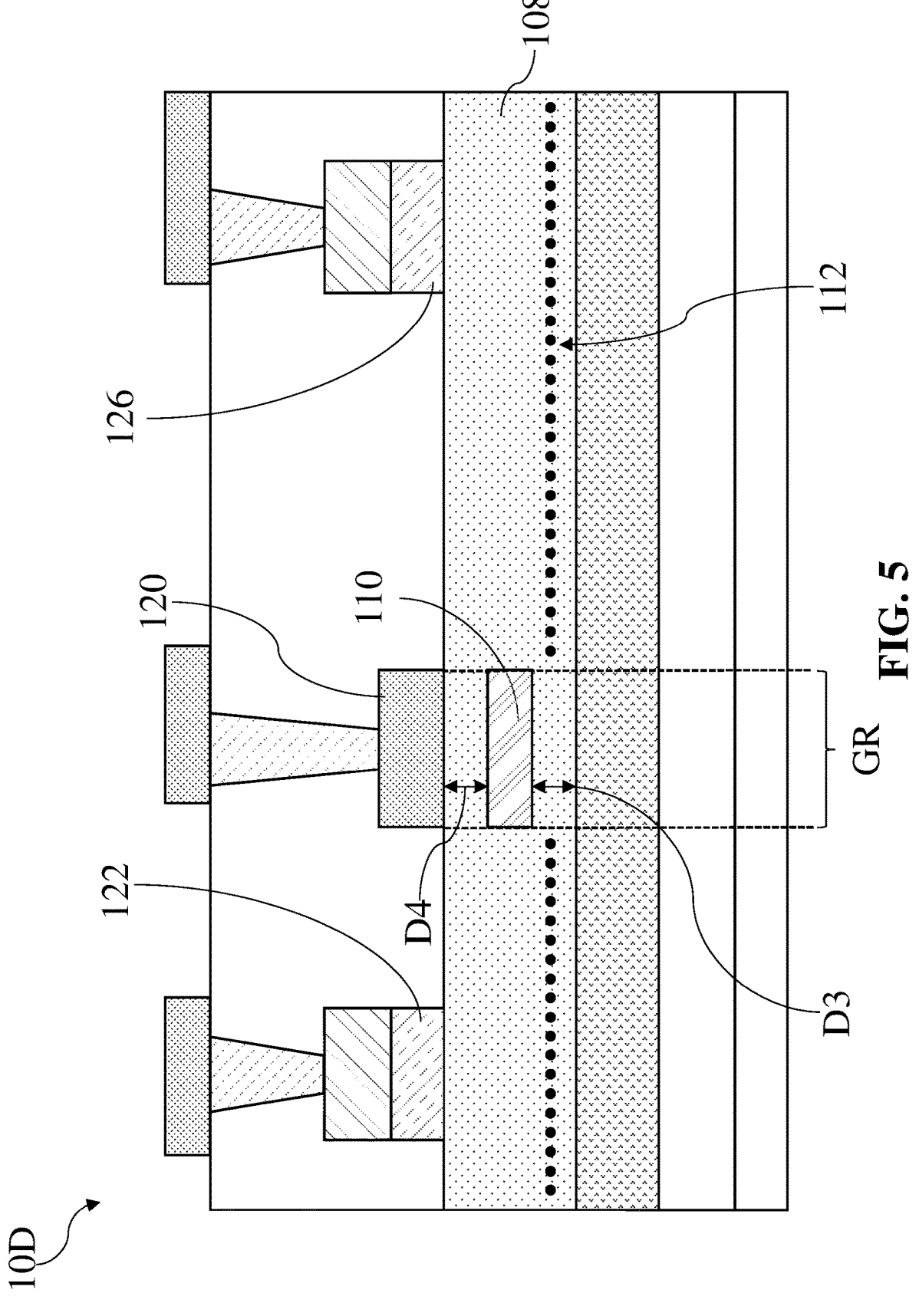
FIG. 5 is a vertical cross-sectional view of a semiconductor device according to some embodiments of the present disclosure.

FIG. 5 is a vertical cross-sectional view of a semiconductor device 10D according to some embodiments of the present disclosure. In the exemplary illustration of FIG. 5, a top surface of the nitride-based semiconductor layer 108 can be a flat surface, such that the gate electrode 120 and the nitride-based semiconductor layers 122 and 126 can be disposed at substantially the same level height. As compared to the semiconductor device 10A, the gate electrode 120 can be closer to the gate region GR of the nitride-based semiconductor layer 108, and thus the conductivity of the gate region GR can be better controlled. Moreover, the gate electrode 120 and the nitride-based semiconductor layer 110 can have substantially same width, as afore-mentioned.

The vertical position of the nitride-based semiconductor layer 110 is adjustable. The nitride-based semiconductor layer 110 is spaced apart from the heterojunction by a distance D3. The nitride-based semiconductor layer 110 is spaced apart from the top-most surface of the nitride-based semiconductor layer 108 by a distance D4. The relationship between the distances D3 and D4 can be related to the carrier concentration of the 2DHG region 112 and the threshold voltage of the semiconductor device 10D.

In some embodiments, the distances D3 is equal to the distance D4. In some embodiments, the distances D3 is greater than the distance D4. In some embodiments, the distances D3 is less than the distance D4. The electrical properties of the semiconductor device 10D can be adjusted through the relationship between the distances D3 and D4, so as to meet different device requirements. As such, the design of the embodiments of the present disclosure is flexible and convenient to tune the electrical properties of the semiconductor device 10D, being available to satisfy different device requirements.

Different stages of a method for manufacturing the semiconductor device 10D are shown in FIG. 6A, FIG. 6B, FIG. 6C and FIG. 6D, as described below. In the following, deposition techniques can include, for example but are not limited to, ALD, PVD, CVD, MOCVD, PECVD, LPCVD, plasma-assisted vapor deposition, epitaxial growth, or other suitable processes.

Figures 6A, 6B:
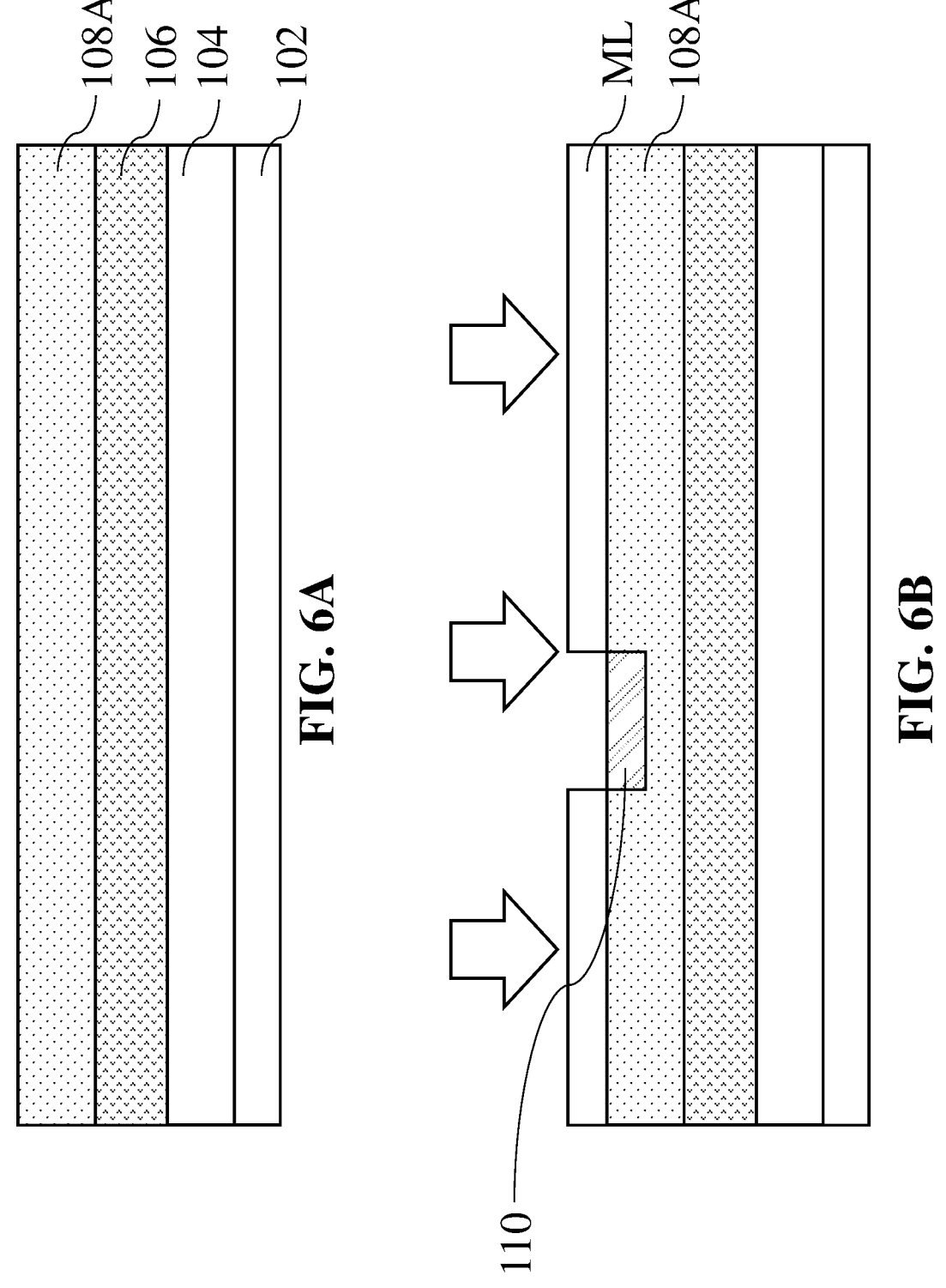
FIG. 6A, FIG. 6B, FIG. 6C, and FIG. 6D show different stages of a method for manufacturing a nitride-based semiconductor device according to some embodiments of the present disclosure.

Referring to FIG. 6A, a buffer layer 104 is formed on a substrate 102 by using deposition techniques. A nitride-based semiconductor layer 106 is formed on the buffer layer 104 by using deposition techniques. A nitride-based semiconductor layer 108A can be formed on the nitride-based semiconductor layer 106 by using deposition technique, so that a heterojunction is formed therebetween.

Referring to FIG. 6B, a mask layer ML is provided on the nitride-based semiconductor layer 108A to expose a portion thereof. Then, an ion implantation process is performed on the exposed portion of the nitride-based semiconductor layer 108A, such that the exposed portion of the nitride-based semiconductor layer 108A becomes the nitride-based semiconductor layer 110. The intensity of the ion implantation process is controlled such that the nitride-based semiconductor layer 110 has a bottom separated from a bottom-most surface of the nitride-based semiconductor layer 108A.

Specifically, the exposed portion of the nitride-based semiconductor layer 108A can be doped with an n-type dopant by the ion implantation process, in which the n-type dopant can include but not be limited to C, Si, and Ge. In addition, since the ion implantation process would not have much influence on the surface morphology of the nitride-based semiconductor layer 110, a top surface of the nitride-based semiconductor layer 110 can be coplanar with a top surface of the remaining portion of the nitride-based semiconductor layer 108A.

Figures 6C, 6D:
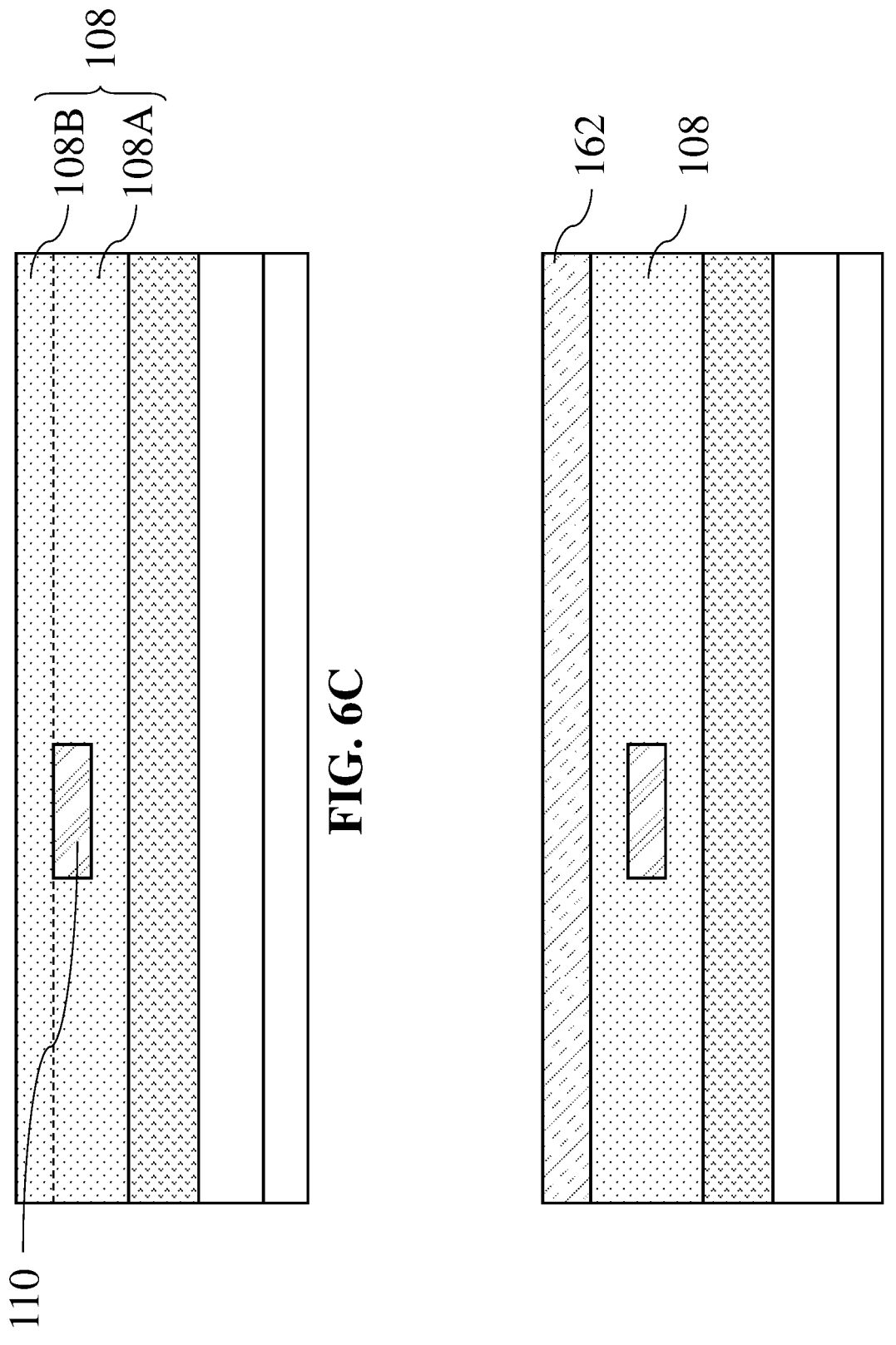

Referring to FIG. 6C, the mask layer ML is removed. A nitride-based semiconductor layer 108B is formed to cover the nitride-based semiconductor layers 108A and 110. The conductivity types of the nitride-based semiconductor layers 108A and 108B are undoped. The nitride-based semiconductor layers 108A and 108B can be merged to become a nitride-based semiconductor layer 108. Since the top surface of the nitride-based semiconductor layer 110 is coplanar with a top surface of the remaining portion of the nitride-based semiconductor layer 108A, a top surface of the nitride-based semiconductor layer 108B can be a flat surface.

Referring to FIG. 6D, a blanket nitride-based semiconductor layer 162 is formed on the nitride-based semiconductor layer 108, in which the conductivity type of the blanket nitride-based semiconductor layer 162 is a p-type. Then, a patterning process is performed on the blanket nitride-based semiconductor layer 162 for removing excess portions thereof, so as to form the nitride-based semiconductor layers 122 and 126. Thereafter, the source electrode 124, the drain electrode 128, the passivation layer 140, the contact vias 150, and the patterned conductive layer 152 can be formed, obtaining the configuration of the semiconductor device 10D as shown in FIG. 5.

Figure 7:
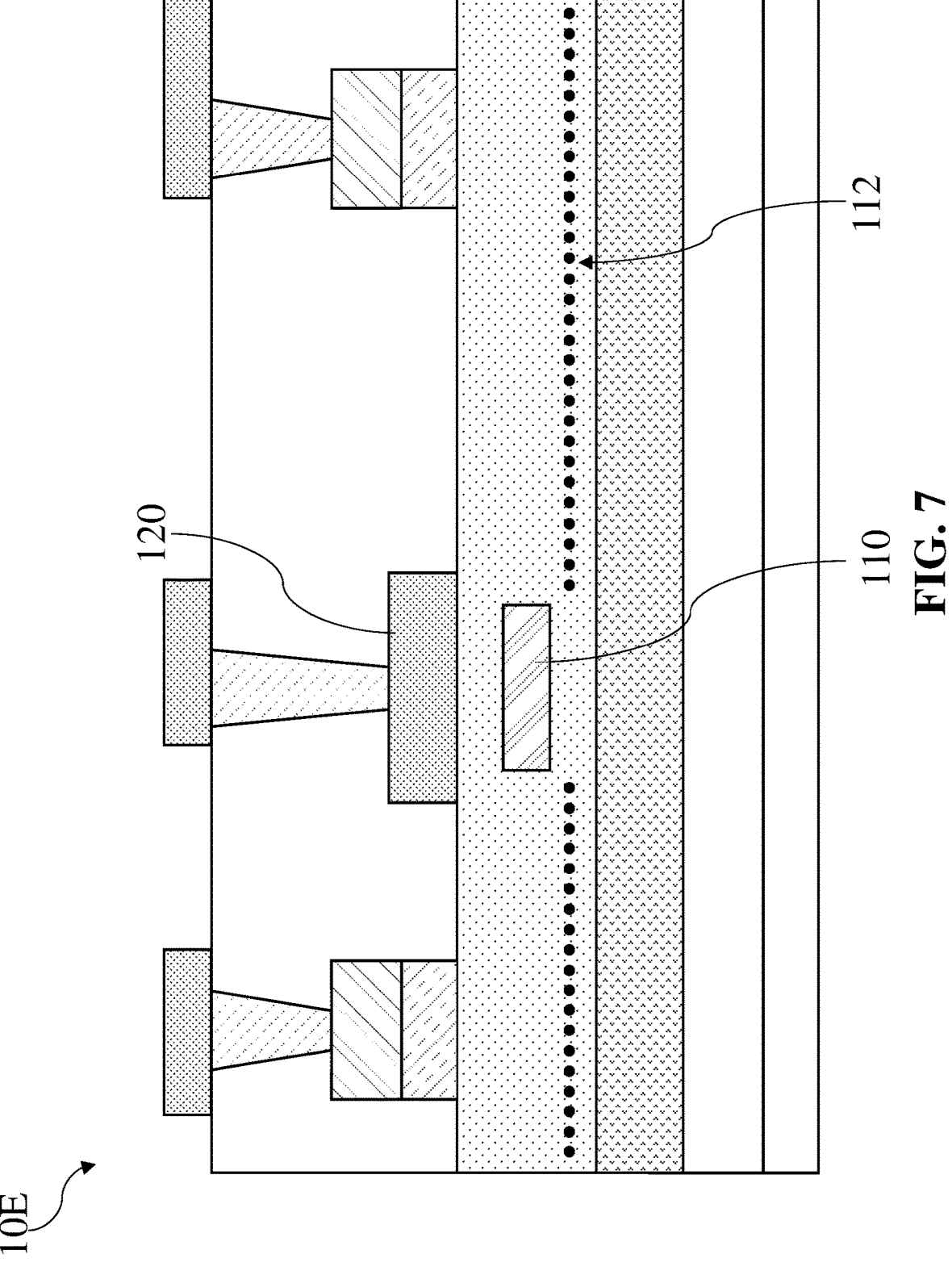
FIG. 7 is a vertical cross-sectional view of a semiconductor device according to some embodiments of the present disclosure.

FIG. 7 is a vertical cross-sectional view of a semiconductor device according to some embodiments of the present disclosure. In the exemplary illustration of FIG. 7, a width of the gate electrode 120 can be greater than that of the nitride-based semiconductor layer 110.

In the semiconductor devices 10E, the gate electrode 120 is wider than the nitride-based semiconductor layer 110. Such a configuration can bear high process variation. Moreover, the gate electrode 120 can overlap with at least one zone of the 2DHG region 112, and thus the gate electric field may assist to increase the conductivity of the overlapping zone as a voltage is applied to the gate electrode 120, thereby reducing the on-resistance of the semiconductor devices 10E.

Based on the above description, in the embodiments of the present disclosure, two nitride-based semiconductor layers with different bandgaps are stacked to form a heterojunction therebetween with a 2DHG region. The 2DHG region is present in the nitride-based semiconductor layer which is called a p-channel layer. A region in the p-channel layer is doped to have an n-type, such that the n-type doped region can provide electrons to deplete/neutralize the zone of the 2DHG region therein. Hence, the p-channel enhancement mode semiconductor device can be realized. The manufacturing process of the semiconductor device is simple and avoids formation of a recess into the p-channel layer. Thus, the semiconductor device of the present disclosure can have a good reliability, good electrical properties, and a good yield rate.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or reordered to form an equivalent method without departing from the teachings of the present disclosure. Accordingly, unless specifically indicated herein, the order and grouping of the operations are not limitations.

The invention claimed is:

1. A semiconductor device comprising:
a first nitride-based semiconductor layer;
a second nitride-based semiconductor layer disposed on the first nitride-based semiconductor layer and having a bandgap less than a bandgap of the first nitride-based semiconductor layer, so as to form a heterojunction therebetween with a two-dimensional hole gas (2DHG) region;
a third nitride-based semiconductor layer embedded in the second nitride-based semiconductor layer and spaced apart from the first nitride-based semiconductor layer, wherein the third nitride-based semiconductor layer is doped to have a first conductivity type different than that of the second nitride-based semiconductor layer;
a source electrode and a drain electrode disposed on the second nitride-based semiconductor layer; and
a gate electrode disposed over the second nitride-based semiconductor layer and between the source and drain electrodes, wherein the gate electrode is located directly over the third nitride-based semiconductor layer,
wherein the second nitride-based semiconductor layer has a protruding portion directly above the third nitride-based semiconductor layer and extending away from the third nitride-based semiconductor layer.

2. The semiconductor device of claim 1, wherein the first conductivity type is an n-type such that the third nitride-based semiconductor layer depletes a zone of the 2DHG region directly beneath the third nitride-based semiconductor layer, resulting in the semiconductor device having an enhancement mode.

3. The semiconductor device of claim 1, wherein the second and third nitride-based semiconductor layers have the same group III element and the same group V element, and the second nitride-based semiconductor layer is an intrinsic semiconductor and the third nitride-based semiconductor layer is an n-type semiconductor.

4. The semiconductor device of claim 1, wherein the gate electrode has a pair of opposite edges aligning with a pair of opposite edges of the third nitride-based semiconductor layer, respectively.

5. The semiconductor device of claim 1, wherein the source electrode is closer to the third nitride-based semiconductor layer than the drain electrode.

6. The semiconductor device of claim 1, wherein the gate electrode is in contact with the protruding portion.

7. The semiconductor device of claim 1, wherein the source and drain electrodes are spaced apart from the protruding portion.

8. The semiconductor device of claim 1, wherein each of the source and drain electrodes is in a position higher than the protruding portion.

9. The semiconductor device of claim 1, further comprising:
a fourth nitride-based semiconductor layer disposed between the second nitride-based semiconductor layer and the source electrode and doped to have a second conductivity type different than the first conductivity type; and
a fifth nitride-based semiconductor layer disposed between the second nitride-based semiconductor layer and the drain electrode and doped to have the same conductivity type as the fourth nitride-based semiconductor layer.

10. The semiconductor device of claim 9, wherein the third, fourth, and fifth nitride-based semiconductor layers have the same group III element and the same group V element, and the third nitride-based semiconductor layer is an n-type semiconductor and the fourth and fifth nitride-based semiconductor layers are p-type semiconductors.

11. The semiconductor device of claim 9, wherein the second nitride-based semiconductor layer has a protruding portion directly above the third nitride-based semiconductor layer and spaced apart from the fourth and fifth nitride-based semiconductor layers.

12. The semiconductor device of claim 9, wherein the gate electrode is spaced apart from the fourth and fifth nitride-based semiconductor layers.

13. The semiconductor device of claim 1, wherein the third nitride-based semiconductor layer is separated from the heterojunction by a portion of the second nitride-based semiconductor layer.

14. The semiconductor device of claim 1, wherein the gate electrode has a width greater than a width of the third nitride-based semiconductor layer.

15. A method for manufacturing a semiconductor device, comprising:

forming a first nitride-based semiconductor layer;

forming a second nitride-based semiconductor layer on the first nitride-based semiconductor layer to form a heterojunction therebetween;

forming a third nitride-based semiconductor layer on the second nitride-based semiconductor layer and spaced apart from the first nitride-based semiconductor layer, wherein the third nitride-based semiconductor layer is doped to have a conductivity type different than that of the second nitride-based semiconductor layer;

forming a fourth nitride-based semiconductor layer to cover the second and third nitride-based semiconductor layers;

forming a gate electrode above the fourth nitride-based semiconductor layer and aligning with the third nitride-based semiconductor layer; and forming a source electrode and a drain electrode above the fourth nitride-based semiconductor layer and spaced apart from the third nitride-based semiconductor layer, wherein the fourth nitride-based semiconductor layer has a protruding portion directly above the third nitride-based semiconductor layer and extending away from the third nitride-based semiconductor layer.

16. The method of claim 15, wherein forming the third nitride-based semiconductor layer comprises:

forming a blanket nitride-based semiconductor layer on the second nitride-based semiconductor layer; and patterning the blanket nitride-based semiconductor layer to form the third nitride-based semiconductor layer.

17. The method of claim 15, wherein forming the third nitride-based semiconductor layer comprises:

performing an ion implantation process on a portion of the second nitride-based semiconductor layer such that the portion of the second nitride-based semiconductor layer becomes the third nitride-based semiconductor layer.

18. The method of claim 15, wherein the second and third nitride-based semiconductor layers have the same group III element and the same group V element, and the second nitride-based semiconductor layer is an intrinsic semiconductor and the third nitride-based semiconductor layer is an n-type semiconductor.

19. The method of claim 15, wherein the fourth nitride-based semiconductor layer is formed such that the second and fourth nitride-based semiconductor layers are merged.

20. A semiconductor device comprising:

a first nitride-based semiconductor layer;

a second nitride-based semiconductor layer disposed on the first nitride-based semiconductor layer and having a bandgap less than a bandgap of the first nitride-based semiconductor layer, so as to form a heterojunction therebetween with a two-dimensional hole gas (2DHG) region;

a third nitride-based semiconductor layer completely embedded in the second nitride-based semiconductor layer and spaced apart from the first nitride-based semiconductor layer, wherein the third nitride-based semiconductor layer is doped to have a first conductivity type different than that of the second nitride-based semiconductor layer;

a source electrode and a drain electrode disposed on the second nitride-based semiconductor layer; and a gate electrode disposed over the second nitride-based semiconductor layer and between the source and drain electrodes, wherein the gate electrode is located directly over the third nitride-based semiconductor layer, wherein the third nitride-based semiconductor layer is spaced apart from the gate electrode by a portion of the second nitride-based semiconductor layer.

* * * * *